United States Patent [19]

Buys et al.

[11] Patent Number: 5,481,251
[45] Date of Patent: Jan. 2, 1996

[54] MINIMAL FUNCTION REMOTE CONTROL WITHOUT DIGIT KEYS AND WITH A POWER TOGGLE PROGRAM AND WITH A CHANNEL ROTATION PROGRAM

[75] Inventors: Menno Buys, Hengelo, Netherlands; Patrick Hayes, Mission Viejo; Kimthoa Nguyen, Yorba Linda, both of Calif.

[73] Assignee: Universal Electronics Inc., Del.

[21] Appl. No.: 158,601

[22] Filed: Nov. 29, 1993

[51] Int. Cl.$^6$ .................................................. G05B 19/02
[52] U.S. Cl. ............................... 340/825.22; 340/825.72; 455/151.2; 341/176
[58] Field of Search .................... 340/825.22, 825.69, 340/825.72, 825.03, 825.56; 455/151.1, 151.2; 348/734; 347/176

[56] References Cited

U.S. PATENT DOCUMENTS

| 3,886,307 | 5/1975 | Evans et al. |
| 4,495,654 | 1/1985 | Deiss ..................................... 455/151.2 |
| 4,566,034 | 1/1986 | Harger et al. ............................ 348/734 |
| 4,856,081 | 8/1989 | Smith .............................. 340/825.69 X |

FOREIGN PATENT DOCUMENTS

| 0435370 | 7/1991 | European Pat. Off. |
| 2218234 | 11/1989 | United Kingdom |

Primary Examiner—Donald J. Yusko
Assistant Examiner—Edwin C. Holloway, III
Attorney, Agent, or Firm—Thomas R. Vigil; Larry J. Chapa

[57] ABSTRACT

The remote control comprises: a microprocessor including a CPU and memory; a keypad including several keys coupled to the microprocessor for operating the remote control, some of the keys being a "POWER" key, a "Channel Up" key and a "Channel Down" key; lamp driver circuitry coupled to the microprocessor; structure and program instructions, including said microprocessor, for generating infrared (IR) signals coupled to the IR lamp driver circuitry; and code data for executing command functions for operating a home entertainment device stored in the memory. A power toggle program is stored in the memory for effecting the sending of the IR code for "STANDBY" or the IR code for the number digit "1" each time the power key is pressed. Also a channel rotation program is stored in the memory for effecting the sending of digit number signals in an ascending or descending order number digit each time the "Channel Up" key is pressed or the "Channel Down" key is pressed.

10 Claims, 4 Drawing Sheets

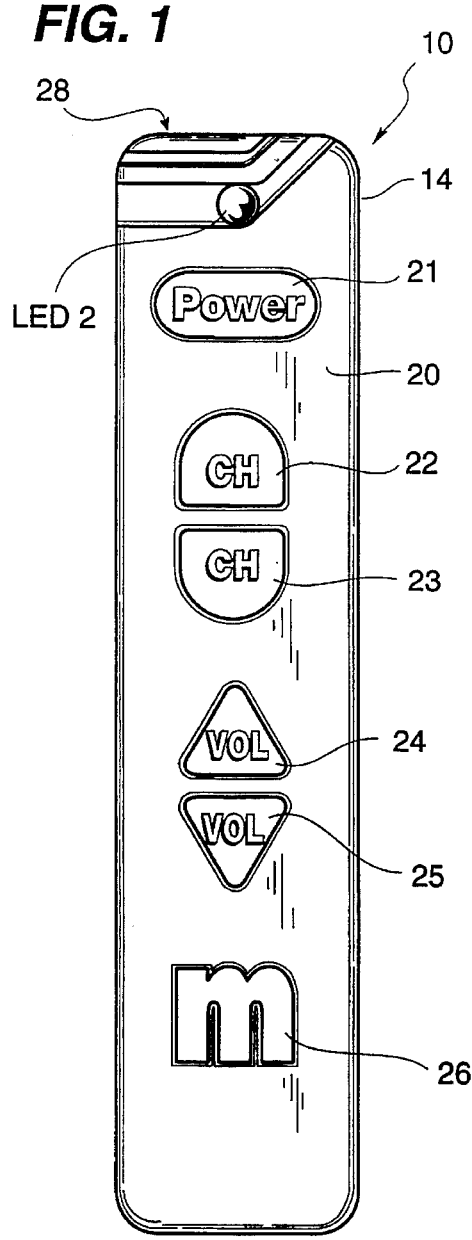
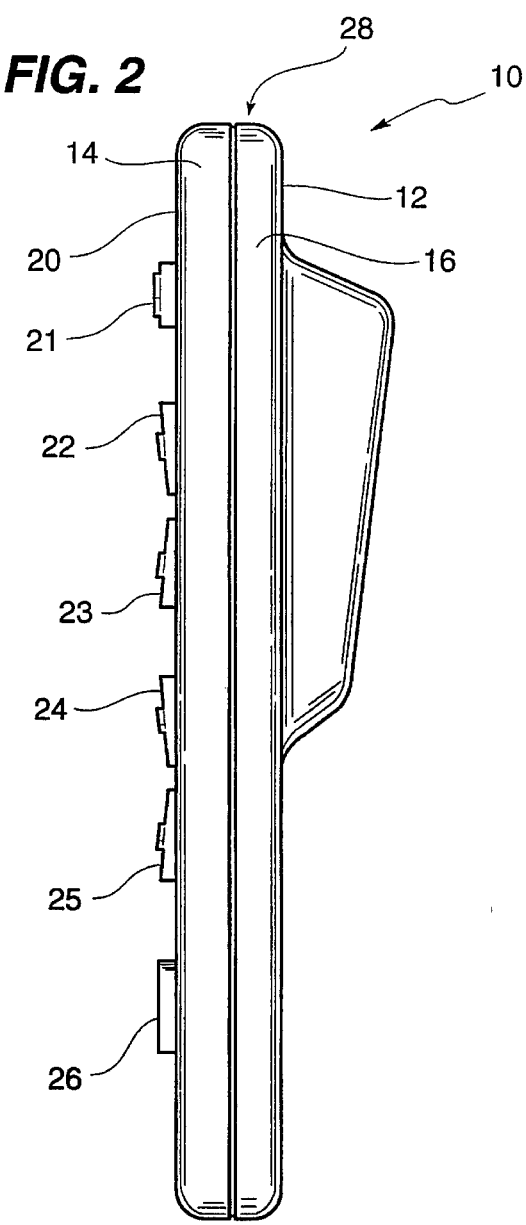
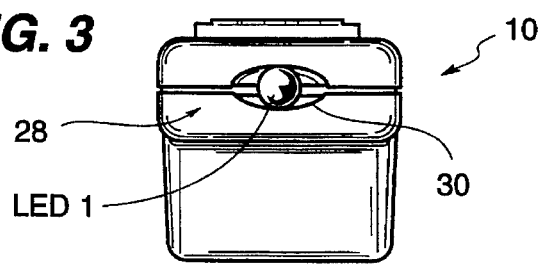

5,481,251

MINIMAL FUNCTION REMOTE CONTROL WITHOUT DIGIT KEYS AND WITH A POWER TOGGLE PROGRAM AND WITH A CHANNEL ROTATION PROGRAM

BACKGROUND OF THE INVENTION

1. Field of the Invention

The present invention relates to a minimal function key remote control which does not include digit keys but only "CHANNEL UP" and "CHANNEL DOWN" keys and a "POWER" (off) key.

2. Description of the related art including information disclosed under 37 CFR §§1.97–1.99.

The trend in consumer remote control units is towards simplicity and a reduced number of large, easily readable keys. Accordingly, remote control devices equipped with only basic function keys are becoming increasingly popular, both as replacement remote control units and as "a second remote control".

Many of these remote control units do not include digit keys, but simply offer "CHANNEL UP" and "CHANNEL DOWN" only.

However, the usefulness of this type of remote control, when marketed as a universal remote control, is limited by the lack of digit keys in two situations:

1. Some manufacturers of remote controls have defined the "POWER" function such that it only turns the TV set or other device to be controlled off. The user turns on the device to be controlled, e.g., a TV set, by pressing any one of the digit keys. Often in this situation, the "POWER" key is referred to as a "STANDBY" key for effecting a standby function, i.e., it switches the TV set (or other device) into a standby mode, ready to turn the TV set back on when the next channel number key is selected.

2. Some controlled devices, e.g., TV sets, do not offer a "CHANNEL UP" or "CHANNEL DOWN" function. Such devices to be controlled accept only direct entry of channel number digits. Often these "channels" do not correspond directly to broadcast channel numbers, but are instead "preset" by the user to preferred stations (just like a car radio).

Controlled devices with these features are much more prevalent in Europe than in the United States market, although they are found worldwide.

SUMMARY OF THE INVENTION

According to the present invention there is provided a remote control comprising: a microprocessor including a CPU and memory; a keypad including several keys coupled to the microprocessor for operating the remote control, one of the keys being a power key; lamp driver circuitry coupled to the microprocessor; structure and program instructions, including said microprocessor, for generating infrared (IR) signals coupled to the IR lamp driver circuitry; code data for executing command functions for operating a home entertainment device stored in the memory; and a power toggle program stored in the memory for effecting the sending of the IR code for "STANDBY" or the IR code for the number digit "1" each time the power key is pressed.

Also according to the present invention there is provided a remote control comprising: a microprocessor including a CPU and memory; a keypad including several keys coupled to the microprocessor for operating the remote control, two of the keys being a "Channel Up" key and a "Channel Down" key; lamp driver circuitry coupled to the microprocessor; structure and program instructions, including the microprocessor, for generating infrared (IR) signals coupled to the IR lamp driver circuitry; code data for executing command functions for operating a home entertainment device stored in the memory; and a channel rotation program stored in the memory for effecting the sending of digit number signals in an ascending or descending order number digit each time the "Channel Up" key is pressed or the "Channel Down" key is pressed.

BRIEF DESCRIPTION OF THE DRAWINGS

FIG. 1 of the drawings is a top plan view a remote control having a minimal number of function keys.

FIG. 2 of the drawings is a side view of the remote control shown if FIG. 1 as taken along line 2—2 of FIG. 1.

FIG. 3 of the drawings is a front end view of the remote control shown in FIG. 1 as taken along line 3—3 of FIG. 1.

DESCRIPTION OF THE PREFERRED EMBODIMENT(S)

Figure 4:
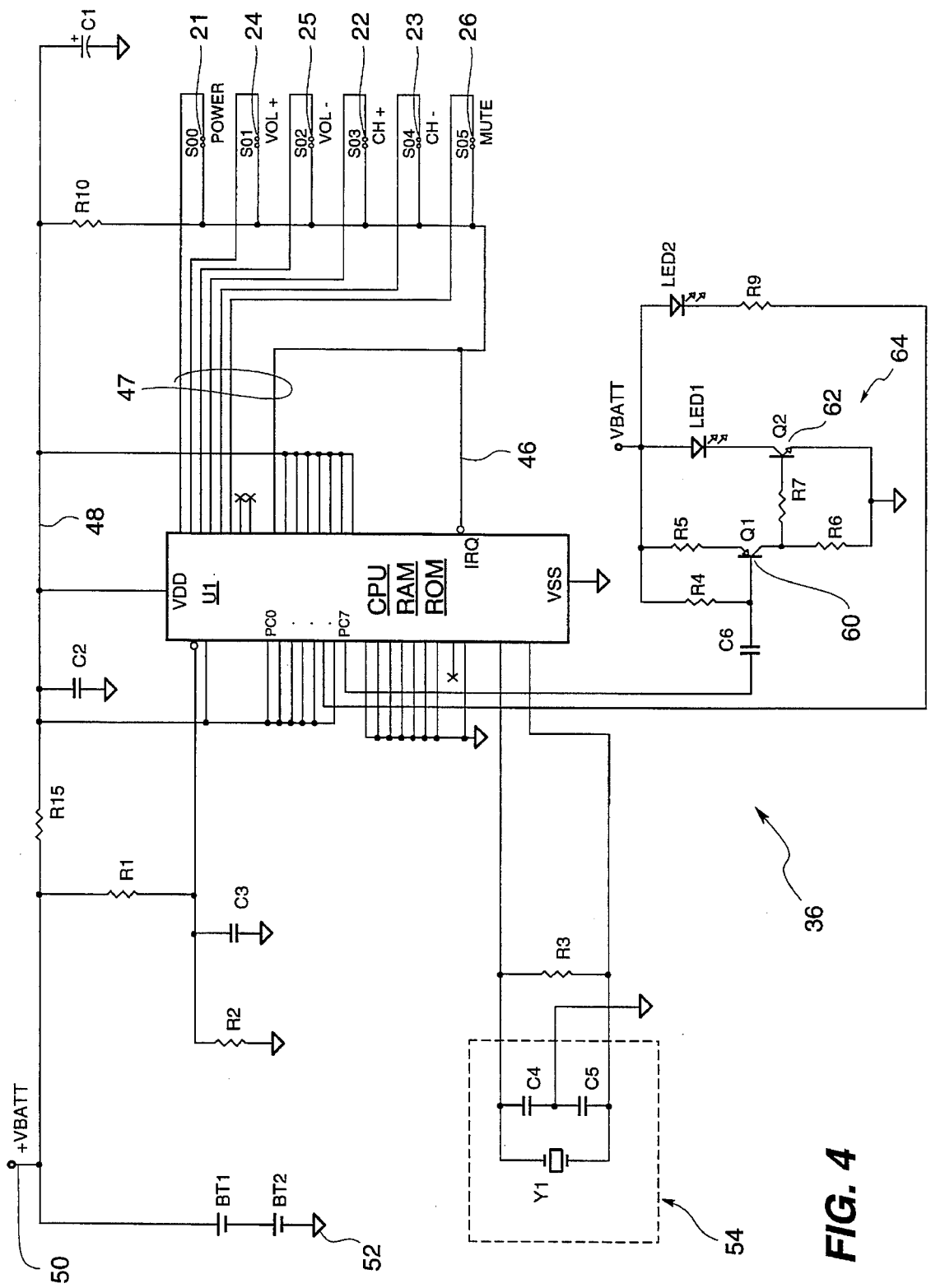
FIG. 4 of the drawings is a schematic circuit diagram of the electrical circuit of the remote control shown in FIG. 1.

Referring now to FIG. 1 in greater detail, there is illustrated therein a remote control 10 constructed according to the teachings of the present invention. As shown, the remote control 10 includes a housing 12 (FIG. 2) including an upper housing member 14, and a lower housing member 16 (FIG. 2).

The upper housing member 14 has an upper wall 20 through which several operating keys or pushbuttons 21–26 extend.

The pushbuttons or keys 21–26 are "POWER", key 21, "CH" (channel up) , key 22, "CH" (channel down) , key 23, "VOL" (volume up) , key 24, "VOL" (volume down) , key 25, and "M" (mute), key 26 which are arranged in a column as indicated below:

POWER
CH
CH
VOL
VOL
M

The manner in which these pushbuttons or keys 21–26 are used is apparent from their names. However the "POWER" key 21 is operable only to send a number digit infrared (IR) code, usually digit "1" or an IR code for "STANDBY".

It is to be noted that the remote control 10 does not have number digit keys, although, according to the teachings of the present invention, it is operable to operate devices to be controlled, such as TV set, that is designed and programmed to receive IR codes for number digits for operating the device to be controlled.

FIG. 2 is a side view of the remote control 10.

As shown in FIG. 3, at a top or forward end 28 of the remote control 10 there is provided an opening or window 30 for at least one infra-red light emitting diode, LED 1.

Also, on the upper wall 20 (FIG. 1) of the upper housing member 12 of the remote control 10, there is provided another light emitting diode, LED 2, by which information be communicated to the user of the remote control 10.

The infra-red light emitting diode LED 1 is held securely in place in the window 30 and is adapted to be aimed at a home entertainment device to be controlled. The diode LED 1 is generally in alignment with diode LED 2 and is coupled to an electrical circuit 36 (FIG. 4) of the remote control 10.

The light-emitting diode LED 2 is generally centrally located for indicating when an individual key 21–26 is pressed on the remote control 10. The diode LED 2 is a visible indicator that the remote control 10 is working. If the diode LED 2 does not light when one of the keys 21–26 is pressed, the batteries may need to be replaced.

FIG. 4 is a block electrical schematic circuit diagram of the electrical operating circuit 36 which is mounted in the remote control 10 and which includes a microprocessor U1, including a RAM, a ROM and a CPU. The keys 21–26 are coupled to the microprocessor U1 by an interrupt line 46, a plurality of switch contact lines 47 and a bus 48 to the microprocessor U1.

A power supply in the form of a battery is connected between a+voltage input 50 to the microprocessor U1 and a system ground 52.

Capacitors C1 and C2 provide power supply filtering for the power line.

An oscillator circuit 54 provides a clock frequency for the microprocessor U1.

The microprocessor U1 includes output PC7 to a pair of power transistors 60 and 62 of an IR lamp driver circuit 64 which outputs a voltage to the light emitting diodes LED 1 for allowing a signal to flow through the transistors 60 and 62 for activating the infra-red light emitting diode LED 1 for controlling an home entertainment device output PC5 for activating and the indicator diode LED 2.

According to the teachings of the present invention, the remote control 10 has a power toggle program and a channel rotation program in order to overcome the two problems of:

1. Remote controls that have defined the "POWER" function so that it only turns the device to be controlled off and where the user turns on the device to be controlled, e.g., a TV set, by pressing any one of the digit keys. With this remote control, the "POWER" key operates as a "STANDBY" key for effecting a standby function, i.e., it switches the TV (or other device to be controlled) into a standby mode, ready to turn the TV set back on when the next channel number key is selected by depressing one or more number digit keys.

2. TV sets that do not offer a "CHANNEL UP" or "CHANNEL DOWN" function. Such TV sets or other devices to be controlled only accept direct entry of channel number digits. Often these "channels" do not correspond directly to broadcast channel numbers, but are instead "preset" by the user to preferred stations (just like a car radio).

Controlled devices, namely TV sets, with these features are much more prevalent in Europe than in the United States market, although they are found worldwide.

Figure 5:
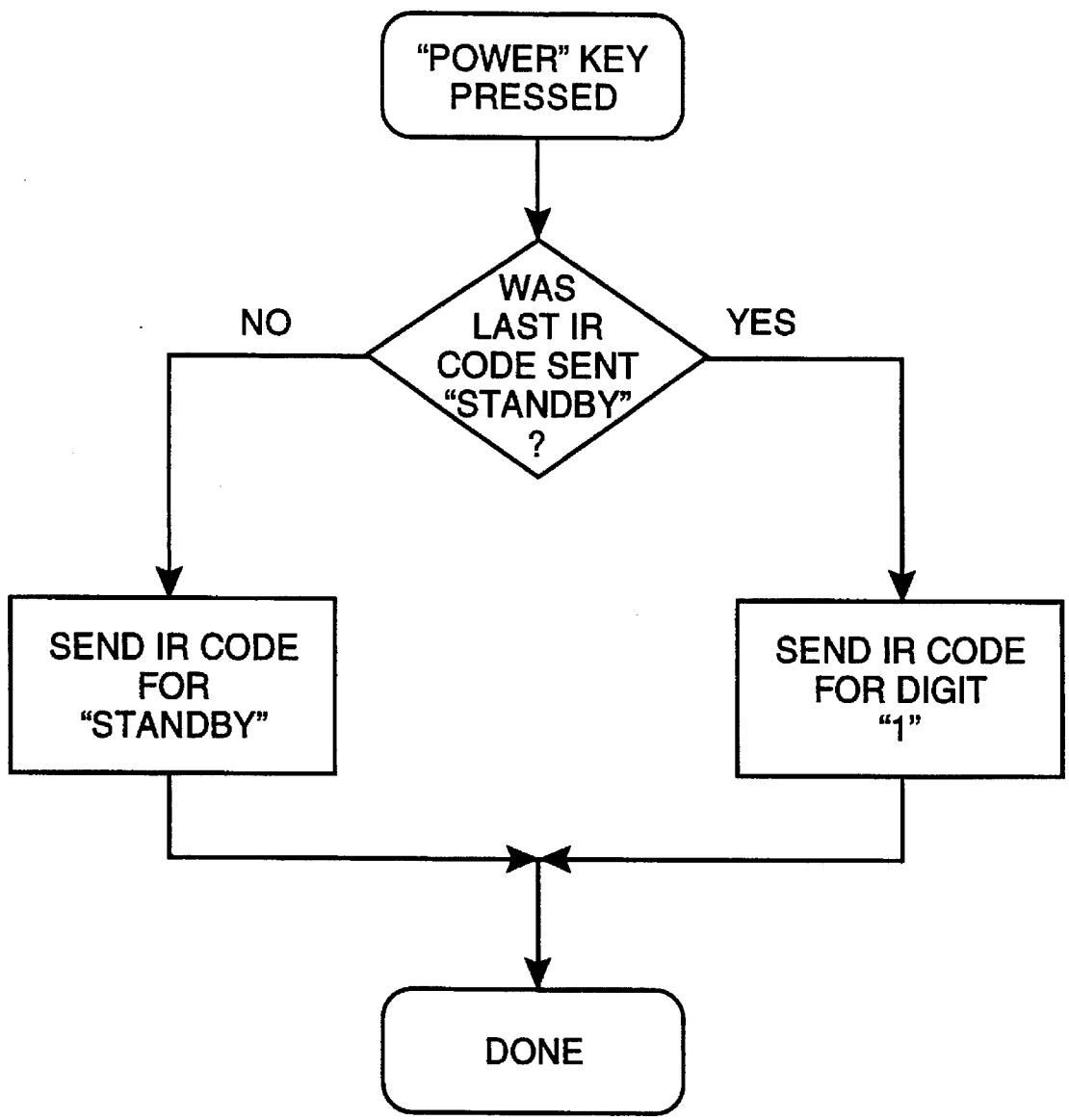
FIG. 5 of the drawings of the drawings is a flow chart of the software for initiating a power toggle procedure.

According to the teachings of the present invention, a power toggle program is stored in the RAM or ROM of the microprocessor U1. With this program, the steps of which are set forth in FIG. 5, initiation of the power function by pressing the "POWER" key 21 automatically toggles the operating program back and forth between sending the IR code for "STANDBY" and the IR code for number digit "1".

Each time the "POWER" key 21 is pressed, the microprocessor U1 checks which of the two codes was sent last, and sends the opposite one. The net effect is that, to the user, the "POWER" key 21 operates exactly like the common "power toggle" function in a more conventional remote control, and no digit key needs to be pressed to turn the TV set or other controlled device on. A minor disadvantage is that the TV set to be controlled always turns the TV set on set to channel 1. However, in many applications this is the user's favorite channel anyway.

Figure 6:
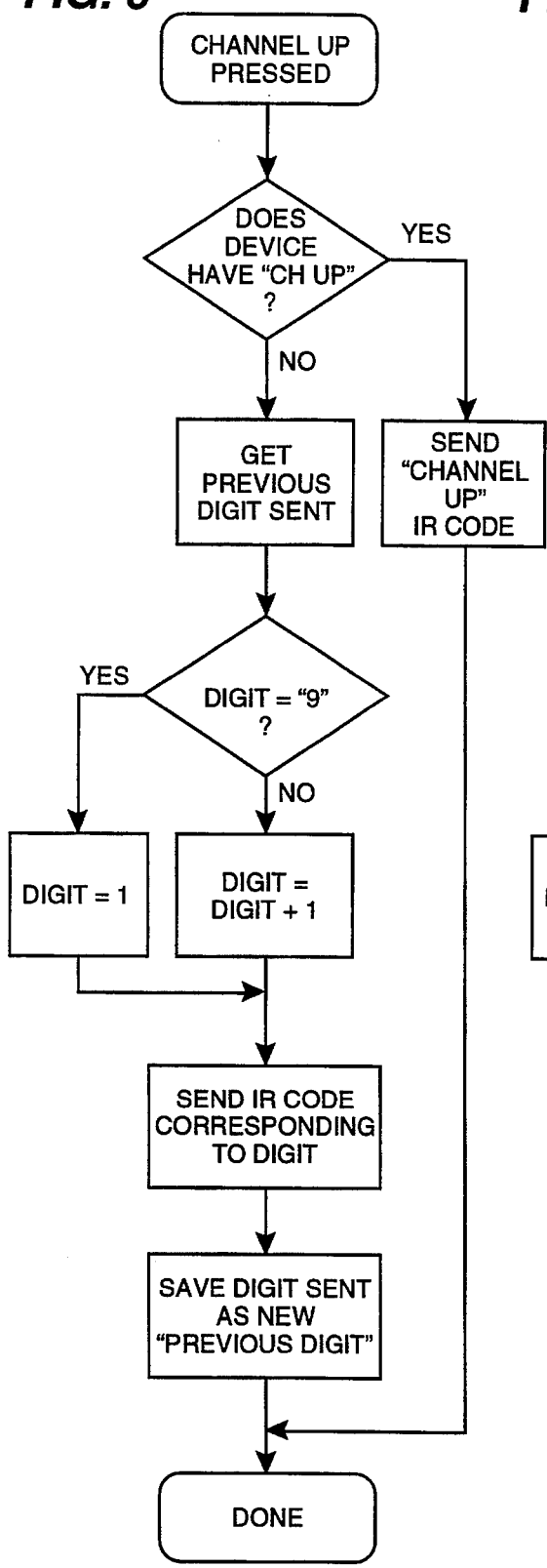
FIG. 6 of the drawings is a flow chart of a channel rotation program in steps of channel up.
Figure 7:
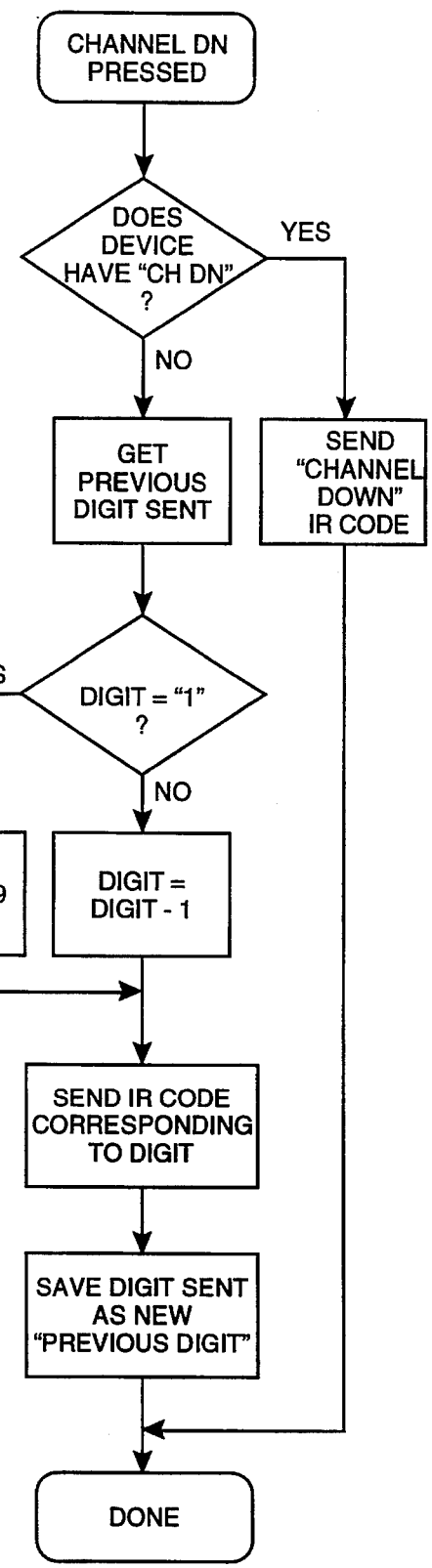
FIG. 7 of the drawings is a flow chart of a channel rotation program in steps of channel down.

Also according to the teachings of the present invention, a channel rotation program is stored in the RAM or ROM of the microprocessor U1. With this channel rotation program, the steps of which are set forth in FIGS. 6 and 7, the user of the remote control 10 in operating a TV set which is programmed to respond to IR codes for number digits can go through an ascending or descending channel scan with the channel rotation program stored in the RAM or ROM. The channel rotation program effects the sending of digit number signals in an ascending or descending order number digit each time the "Channel Up" key is pressed or the "Channel Down" key is pressed.

Upon depression of the "Channel Up" key, the program determines if the device to be controlled has a "Channel Up" function.

If the answer is yes, a "Channel Up" IR code is sent and the program is competed.

If the answer is no, the value of the previous number digit sent is obtained.

Then a determination is made if the previous digit sent equals 9.

If the answer is no, the digit number is set to equal to the previous digit number plus 1.

If the answer is yes, the digit number is set equal to 1.

Then the IR code corresponding to the number digit determined is sent.

Finally the number digit sent is saved as a new "previous digit" and the program is completed.

Upon depression of the "Channel Down" key the channel rotation program determines if the device to be controlled has a "Channel Down" function.

If the answer is yes, a "Channel Down" IR code is sent and the program is completed.

If the answer is no, the value of the previous number digit sent is obtained.

Then a determination is made if the previous digit sent equals 1.

If the answer is no, the number digit is set equal to the previous digit number minus 1.

If the answer is yes, the digit number is set equal to 9.

then the IR code corresponding to the number digit determined is sent.

Finally the number digit sent is saved as a new "previous digit" and the program is completed.

From the foregoing description, it will be apparent that the remote control with power toggle and channel rotation programs stored therein of the present invention has a number of advantages, some of which have been described above and others of which are inherent in the invention. Also it will be understood that modifications can be made to the remote control with power toggle and channel rotation programs stored therein described above without departing from the teachings of the invention. Accordingly the scope of the invention is only to be limited as necessitated as required by the accompanying claims.

We claim:

1. A remote control comprising:

a microprocessor including a CPU and memory means; a keypad including several keys coupled to said microprocessor for operating said remote control, one of said keys being a "POWER" key;

lamp driver circuitry coupled to said microprocessor;

means, including said microprocessor, for generating infrared (IR) signals coupled to said IR lamp driver circuitry;

code data for executing command functions for operating a home entertainment device stored in said memory means;

a power toggle program stored in said memory means for effecting the sending of one of an IR code for "STANDBY" and an IR code for a number digit each time said power key is pressed; and, said power toggle program being operable to check, each time said "POWER" key is pressed, which one of said IR code for "STANDBY" and said IR code for said number digit was last sent by said remote control and then causes said remote control to send the opposite IR code without the need to press a digit key to turn on said home entertainment device.

2. The remote control of claim 1 including means for remembering the last IR code sent, and wherein said power toggle program checks, each time the "POWER" key is pressed, which one of the IR codes for "STANDBY" or number digit "1" was last sent by the remote control and then causes the remote control to send the opposite IR code without the need to press a digit key to turn on the controlled home entertainment device.

3. The remote control of claim 1 wherein said remote control is a minimal function key remote control and wherein said keypad does not include numeric digit keys.

4. A remote control comprising:

a microprocessor including a CPU and memory means;

a keypad including several keys coupled to said microprocessor for operating said remote control, two of said keys being a "Channel Up" key and a "Channel Down" key;

lamp driver circuitry coupled to said microprocessor;

means, including said microprocessor, for generating infrared (IR) signals coupled to said IR lamp driver circuitry;

code data for executing command functions for operating a home entertainment device stored in said memory means;

a channel rotation program stored in said memory means for determining if said home entertainment device has one of a channel up function and channel down function, and, if yes, effecting the sending of a "Channel Up" IR code upon depression of said "Channel Up" key and the sending of a "Channel Down" IR code upon depression of said "Channel Down" key, and, if no, effecting the sending of digit number signals in an ascending order each time said "Channel Up" key is pressed or descending order each time said "Channel Down" key is pressed; and said remote control being capable of providing said "Channel Up" function and said "Channel Down" function in home entertainment devices that do and do not independently support said "Channel Up" function and said "Channel Down" function.

5. The remote control of claim 4 wherein said microprocessor and said channel rotation program include circuit means and program instructions for:

upon depression of the "Channel Up" key, determining if the device to be controlled has a "Channel Up" function;

if the answer is yes, sending a "Channel Up" IR code and exiting the program;

if the answer is no, obtaining the value of the previous number digit sent;

determine if the previous digit sent equals 9;

if the answer is no, set the digit number equal to the previous digit number plus 1;

if the answer is yes, set the digit number equal to 1;

send the IR code corresponding to the number digit determined; and save the number digit sent as a new "previous digit".

6. The remote control of claim 4 wherein said microprocessor and said channel rotation program include circuit means and program instructions for:

upon depression of the "Channel Down" key, determining if the device to be controlled has a "Channel Down" function;

if the answer is yes, sending a "Channel Down" IR code and exiting the program;

if the answer is no, obtaining the value of the previous number digit sent;

determine if the previous digit sent equals 1;

if the answer is no, set the number digit equal to the previous digit number minus 1;

if the answer is yes, set the digit number equal to 9;

send the IR code corresponding to the number digit determined; and save the number digit sent as a new "previous digit".

7. The remote control of claim 4 wherein said remote control is a minimal function key remote control and wherein said keypad does not include numeric digit keys.

8. In a remote control having a "POWER" key, a method of effecting the sending of an IR code for "STANDBY" or the IR code for the digit "1" each time the "POWER" key is pressed, comprising the steps of:

remembering the last IR code sent;

checking, each time the "POWER" key is pressed, which one of the IR codes for "STANDBY" or number digit "1" was last sent by the remote control and then causing the remote control to send the opposite IR code without the need to press a digit key to turn on a controlled home entertainment device.

9. In a remote control having a "Channel Up" key, a method of effecting the sending of digit numbers in ascending order, comprising the steps of:

upon depression of the "Channel Up" key, determining if the device to be controlled has a "Channel Up" function;

if the answer is yes, sending a "Channel Up" IR code and stopping;

if the answer is no, obtaining the value of the previous number digit sent;

determining if the previous digit sent equals 9;

if the answer is no, setting the digit number equal to the previous digit number plus 1;

if the answer is yes, setting the digit number equal to 1;

sending the IR code corresponding to the number digit determined; and saving the number digit sent as a new "previous digit".

10. In a remote control having a "Channel Down" key, a method of effecting the sending of digit numbers in descending order, comprising the steps of:

upon depression of the "Channel Down" key, determining if the device to be controlled has a "Channel Down" function;

if the answer is yes, sending a "Channel Down" IR code and stopping;

if the answer is no, obtaining the value of the previous number digit sent;

determining if the previous digit sent equals 1;

if the answer is no, setting the number digit equal to the previous digit number minus 1;

if the answer is yes, setting the digit number equal to 9;

sending the IR code corresponding to the number digit determined; and

* * * * *

UNITED STATES PATENT AND TRADEMARK OFFICE
CERTIFICATE OF CORRECTION

PATENT NO. : 5,481,251

DATED : January 2, 1996

INVENTOR(S) : Menno Buys, Patrick Hayes and Kimthoa Nguyen

It is certified that error appears in the above-indentified patent and that said Letters Patent is hereby corrected as shown below:

Column 3, line 36, "device output" should be —device and output—.

Column 3, line 37, "activating and the" should be —activating the—.

Column 8, line 7, at the end of claim 10 insert a new paragraph:
  —saving the number digit sent as a new "previous digit".—.

Signed and Sealed this

Twenty-sixth Day of March, 1996

Attest:

BRUCE LEHMAN

*Attesting Officer*    *Commissioner of Patents and Trademarks*